(12) United States Patent
Yang et al.

(10) Patent No.: US 9,929,189 B2
(45) Date of Patent: Mar. 27, 2018

(54) FABRICATION METHOD OF DISPLAY PANEL AND DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Gang Yang, Beijing (CN); Jun Long, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/126,148

(22) PCT Filed: Nov. 27, 2015

(86) PCT No.: PCT/CN2015/095822
§ 371 (c)(1),
(2) Date: Sep. 14, 2016

(87) PCT Pub. No.: WO2016/192337
PCT Pub. Date: Dec. 8, 2016

(65) Prior Publication Data
US 2017/0213857 A1    Jul. 27, 2017

(30) Foreign Application Priority Data
Jun. 3, 2015 (CN) .......................... 2015 1 0300898

(51) Int. Cl.
*H01L 27/12* (2006.01)
*B32B 38/10* (2006.01)
(Continued)

(52) U.S. Cl.
CPC ............ *H01L 27/1259* (2013.01); *B32B 3/30* (2013.01); *B32B 37/18* (2013.01); *B32B 38/10* (2013.01);
(Continued)

(58) Field of Classification Search
CPC ....... G02F 1/1333; G02F 1/13; H01L 51/524; H01L 27/1259; H01L 25/50; B32B 37/18
See application file for complete search history.

(56) References Cited

U.S. PATENT DOCUMENTS 6,501,528 B1   12/2002   Hamada
2002/0101409 A1   8/2002   Yokoyama et al.
(Continued)

FOREIGN PATENT DOCUMENTS

CN    1356226 A    7/2002
CN    1503035 A    6/2004
(Continued)

OTHER PUBLICATIONS

The First Chinese Office Action dated May 11, 2017; Appln. No. 201510300898.9.
(Continued)

*Primary Examiner* — Evan Pert
*Assistant Examiner* — Changhyun Yi
(74) *Attorney, Agent, or Firm* — Ladas & Parry LLP

(57) ABSTRACT

A fabrication method of a display panel and a display panel, and a display device are provided. The display panel is divided into a display region and a non-display region and comprises a first substrate, and the non-display region of the first substrate includes an IC attaching region. The fabrication method comprises a thinning process. The thinning process includes: 1) forming a barrier layer insoluble to a thinning fluid in a region of a first surface of the first substrate of the display panel corresponding to the IC
(Continued)

attaching region; 2) thinning the display panel by adopting the thinning fluid such that a thickness of the IC attaching region of the first substrate is greater than a thickness of the display region of the first substrate; and 3) removing the barrier layer.

12 Claims, 4 Drawing Sheets

(51) Int. Cl.
*B32B 37/18* (2006.01)
*B32B 3/30* (2006.01)
*H01L 25/065* (2006.01)
*H01L 25/00* (2006.01)
*G02F 1/1335* (2006.01)
*G02F 1/1333* (2006.01)
*G02F 1/1341* (2006.01)
*H01L 27/32* (2006.01)
*H01L 51/56* (2006.01)
*H01L 51/52* (2006.01)

(52) U.S. Cl.
CPC .......... *H01L 25/0657* (2013.01); *H01L 25/50* (2013.01); *H01L 27/124* (2013.01); *B32B 2307/202* (2013.01); *B32B 2307/42* (2013.01); *B32B 2309/02* (2013.01); *B32B 2310/0409* (2013.01); *B32B 2457/20* (2013.01); *G02F 1/1341* (2013.01); *G02F 1/133514* (2013.01); *G02F 1/133528* (2013.01); *G02F 2001/133302* (2013.01); *H01L 27/322* (2013.01); *H01L 27/3262* (2013.01); *H01L 51/5237* (2013.01); *H01L 51/56* (2013.01)

(56) References Cited

U.S. PATENT DOCUMENTS

| | | |
|---|---|---|
| 2003/0025869 A1 | 2/2003 | Deary et al. |
| 2005/0140265 A1 | 6/2005 | Hirakata |
| 2005/0248711 A1 | 11/2005 | Miyazaki et al. |
| 2005/0280635 A1 | 12/2005 | Hinata |
| 2011/0012506 A1* | 1/2011 | Seo .................. H01L 51/5259 313/504 |
| 2015/0311409 A1* | 10/2015 | Huang ................ G02F 1/1362 257/99 |

FOREIGN PATENT DOCUMENTS

| | | |
|---|---|---|
| CN | 1515941 A | 7/2004 |
| CN | 1713212 A | 12/2005 |
| CN | 101215099 A | 7/2008 |
| CN | 101604079 A | 12/2009 |
| CN | 1298114 A | 6/2011 |
| CN | 102914904 A | 2/2013 |
| CN | 103189931 A | 7/2013 |
| CN | 104849900 A | 8/2015 |

OTHER PUBLICATIONS

International Search Report and Written Opinion dated Mar. 9, 2016; PCT/CN2015/095822.

* cited by examiner

FABRICATION METHOD OF DISPLAY PANEL AND DISPLAY PANEL AND DISPLAY DEVICE

TECHNICAL FIELD

Embodiments of the present disclosure relate to a fabrication method of a display panel and a display panel, and a display device.

BACKGROUND

A liquid crystal display device comprises a display panel, a Printed Circuit Board (PCB), a driver Integrated Circuit (IC), etc. The display panel and the driver IC are connected with each other by an anisotropic conductive adhesive (ACF) through a chip on glass (COG) process, and the PCB and the display panel are connected with each other by a flexible printed circuit (FPC).

At present, the display panel increasingly has a market tendency of small thickness and high resolution. The driver IC is developed to have a number of pins and a narrow long shape and the length of the driver IC is increased to adapt to the high resolution of the display panel. The display panel is developed to have a small thickness; and for example, the thickness thereof is reduced to 0.5 mm or 0.3 mm from the previous 0.7 mm.

One of the thinning processes of the display panel is to reduce the thickness of a base substrate of the display panel by using a chemical corroding method; for example, a thickness of a common Q-panel or substrate is 1.0 mm, and the thickness thereof is reduced to 0.4 mm by the thinning process.

The fabrication process of the liquid crystal display device comprises the processes of ACF attaching, COG pre-pressing, COG pressing, FPC attaching, PCB attaching, etc. In the COG pressing process, conductive particles in the ACF are pressed between the driver IC and electrodes of the base substrate under the condition of heating, and then the ACF is cured to connect the driver IC and the base substrate together. Since the requirement on resolution is higher and higher, the length of the driver IC is longer and longer, and at the same time the thickness of the base substrate of the display panel is smaller and smaller, accordingly, after the driver IC is bonded to the base substrate and cooled, the driver IC may shrink to generate the bending as shown in FIG. 1 due to the difference of expansion coefficients of the drive IC and the base substrate, and thus two ends of the driver IC generate large stress (tension) to the base substrate. The stress may be then conducted to a display region of the display panel, so that defects such as light leakage and Mura are generated. In FIG. 1, 71 is the driver IC, 21 is the base substrate, and 51 is a lower polarization sheet corresponding to the base substrate 21.

In addition, the driver IC and the FPC are bonded to the base substrate, and the thickness of the portion of the base substrate bonded to the driver IC and the FPC generally is thinner, which is only half of the thickness of other portions of the base substrate. Accordingly, the portion of the base substrate bonded to the driver IC and the FPC is easily damaged during a falling test.

It can be seen that how to realize the non-bending attaching of the driver IC to the base substrate and no damage in the falling test on the basis of reducing thickness of the display panel becomes an urgent problem to be solved.

SUMMARY

According to embodiments of the disclosure, a fabrication method of a display panel is provided. The display panel comprises a first substrate, the display panel is divided into a display region and a non-display region, and the non-display region of the first substrate includes an IC attaching region. The fabrication method comprises a thinning process. The thinning process includes: forming a barrier layer insoluble to a thinning fluid in a region of a first surface of the first substrate of the display panel corresponding to the IC attaching region; thinning the display panel by adopting the thinning fluid such that a thickness of the IC attaching region of the first substrate is greater than a thickness of the display region of the first substrate; and removing the barrier layer.

For example, the thinning fluid is hydrofluoric acid, and the barrier layer is made of a material containing hydrocarbon compound.

For example, the hydrocarbon compound is paraffin, and the barrier layer is formed by applying the paraffin in liquid state to the region of the first surface of the first substrate of the display panel corresponding to the IC attaching region; and the barrier layer is removed by heating.

For example, the hydrocarbon compound is polyethylene, and the barrier layer is formed by applying the polyethylene in liquid state to the region of the first surface of the first substrate of the display panel corresponding to the IC attaching region; and the barrier layer is removed by being heated to 70° C. or more and dissolved in a methylbenzene, amyl acetate or trichloroethylene solvent.

For example, an area of the barrier layer is greater than or equal to that of the IC attaching region of the first substrate.

For example, the method further comprises: cutting the display panel; before cutting, the method further comprises: filling a region of the first surface of the first substrate at least corresponding to the display region with a filler, and after cutting, the method further comprises: removing the filler in the region of the first surface of the first substrate at least corresponding to the display region.

For example, the filling the region of the first surface of the first substrate at least corresponding to the display region with the filler includes: attaching a compensation film to the region of the first surface of the first substrate at least corresponding to the display region, a thickness of the compensation film being less than or equal to a thickness difference between the IC attaching region and the display region in the first substrate; and the removing the filler in the region of the first surface of the first substrate at least corresponding to the display region includes: stripping the compensation film.

For example, the display panel further comprises a second substrate disposed in the display region and opposite to the first substrate; and the fabrication method further comprises: attaching a polarization sheet to a region of the first surface of the first substrate corresponding to the display region; attaching another polarization sheet to a region of a second surface of the second substrate corresponding to the display region; and bonding the driver IC to the IC attaching region of the first substrate.

For example, on the first surface side of the first substrate, a thickness of the polarization sheet is equal to a difference between the thickness of the first substrate corresponding to the IC attaching region and the thickness of the first substrate corresponding to the display region.

According to the embodiments of the disclosure, a display panel is provided. The display panel comprises a first substrate, the display panel is divided into a display region and a non-display region, and the non-display region of the first substrate includes an IC attaching region. A thickness of the IC attaching region of the first substrate is greater than a thickness of the display region of the first substrate, and the IC attaching region of the first substrate protrudes out of the first surface of the first substrate.

For example, a range of difference between the thickness of the IC attaching region of the first substrate and the thickness of the display region of the first substrate is 0.1-0.3 mm.

For example, the display panel further comprises a second substrate disposed in the display region and opposite to the first substrate; the first surface of the first substrate is provided with a polarization sheet, the polarization sheet is disposed in a region corresponding to the display region and having a thickness equal to a difference between the thickness of the IC attaching region of the first substrate and the thickness of the display region of the substrate; and another polarization sheet is disposed in a region of a second surface of the second substrate corresponding to the display region.

According to the embodiments of the disclosure, a display device is provided. The display device comprises the display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to clearly illustrate purposes, technical solutions and advantages of embodiments of the disclosure, the technical solutions of the embodiments will be described in a clearly and fully understandable way in connection with the drawings. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide a fabrication method of a display panel and a display panel formed by adopting the fabrication method. The fabrication method easily forms the display panel that is partially thinned, thereby forms the display panel with regions having different thicknesses, so as to adapt to the attaching of the driver IC, ensure the strength of the display panel and realize the thinning of the display panel; and meanwhile, the thickness of a display region of the display panel is ensured, and defects such as light leakage and COG Mura are avoided.

Figure 1:
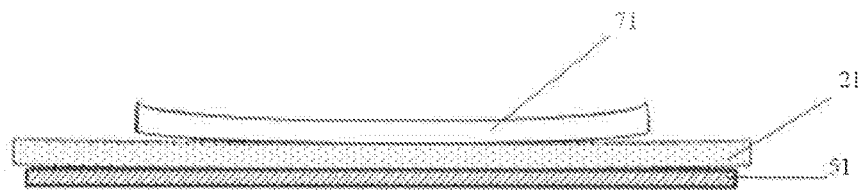
FIG. 1 is a schematic view illustrating that a driver IC in an IC attaching region of a display panel generates bending in prior art.
Figure 2:
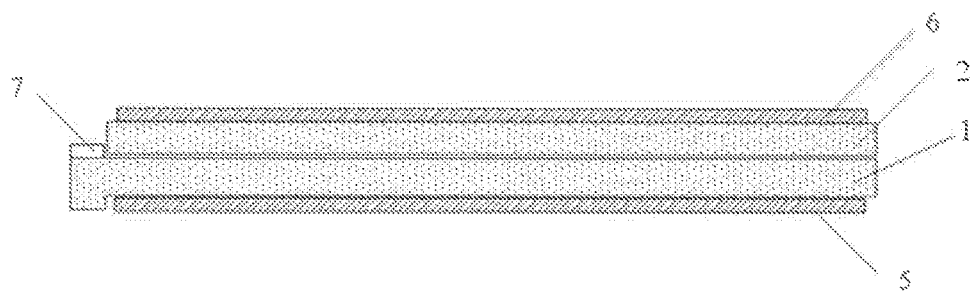
FIG. 2 is a structural schematic view illustrating a display panel according to embodiments of the present disclosure.

Embodiments of the present disclosure provide a display panel, the display panel comprises a first substrate 1 and a second substrate 2 opposite to each other, the first substrate 1 includes a first surface away from the second substrate 2, and the second substrate 2 includes a second surface away from the first substrate 1, as shown in FIG. 2. The display panel comprises a display region and a non-display region, the non-display region of the first substrate includes an IC attaching region, a thickness of the IC attaching region of the first substrate is greater than a thickness of the display region of the first substrate, and the IC attaching region protrudes out of the first surface of the first substrate. Of course, the region having a thickness less than the thickness of the IC attaching region includes the entire display region, and other regions of the non-display region except for the IC attaching region. For example, in the non-display region, the region with less thickness includes all or part of the non-IC attaching region.

For example, a range of difference between the thickness of the IC attaching region of the first substrate and the thickness of the display region of the first substrate is 0.1-0.13 mm, to match the thickness of a lower polarization sheet attached to a back surface of the display panel (i.e., the first surface of the first substrate). For example, the display panel further comprises polarization sheets (including the lower polarization sheet 5 and an upper polarization sheet 6) attached to the region corresponding to the display region. The lower polarization sheet 5 is attached to the region of the back surface (i.e., the first surface of the first substrate) of the display panel corresponding to the display region, and its thickness is equal to the thickness difference between the IC attaching region and the display region of the first substrate. The upper polarization sheet 6 is attached to the region of a front surface (i.e., the second surface of the second substrate) of the display panel corresponding to the display region.

For example, the display panel is a liquid crystal display panel and comprises an array substrate, a color filter substrate and a liquid crystal layer filled between the array substrate and the color filter substrate; in such case, the first substrate 1 is the array substrate, and the second substrate 2 is the color filter substrate. For example, the display panel is an Organic Light-Emitting Diode (OLED) display substrate, and comprises an array substrate and a cover plate, and the array substrate is provided with an OLED device; in such case, the first substrate 1 is the array substrate and the second substrate 2 is the cover plate.

For example, the thinning operation is performed after all functional parts of the display panel are formed and before the driver IC is bonded. For example, the driver IC 7 is bonded to the region of the first substrate 1 that faces the second substrate 2 and is not covered by the second substrate 2 (i.e., the non-display region of a second surface of the first substrate 1, and the second surface of the first substrate is opposite to the first surface of the first substrate). For example, the thickness of the first substrate except for the IC attaching region is thinned, and the IC attaching region is retained to have the greater thickness.

In the fabrication method of the display panel, by controlling the thinning process, the IC attaching region protrudes out of the first surface of the first substrate, such that the thickness of the IC attaching region of the first substrate is increased from 0.2 mm of the existing product to 0.3 mm or more. Further, the lower polarization sheet is disposed in the display region, such that the portion of the first surface of the first substrate corresponding to the IC attaching region is flush with the lower polarization sheet. By increasing the thickness of the IC attaching region of the first substrate, a bending deformation of the driver IC in the process of bonding the driver IC is reduced, thereby avoiding the COG Mura defect caused by severe bending of the IC attaching region of the first substrate in the case that the whole first substrate is thin and the driver IC needs to be bonded to the first substrate; in the meantime, strength of the region of the display panel corresponding to the IC attaching region is improved and the reliability of the display device in a falling process is improved.

For example, the fabrication method of the display panel comprises a thinning process, and the thinning process includes:

1) Forming a barrier layer insoluble to a thinning fluid employed in the thinning process in a region of the first surface of the first substrate of the display panel corresponding to the IC attaching region. By providing the barrier layer in the IC attaching region, the thickness of the IC attaching region covered by the barrier layer is prevented from being thinned;

2) Thinning the display panel by adopting the thinning fluid such that the thickness of the IC attaching region of the first substrate is greater than the thickness of the display region of the first substrate. Of course, as described above, the thickness of the IC attaching region of the first substrate is also greater than the thickness of the non-IC attaching region of the non-display region of the first substrate; and 3) Removing the barrier layer.

In the above thinning process, for example, the thinning fluid is hydrofluoric acid, the barrier layer is made of, for example, a material containing hydrocarbon compound, and the hydrocarbon compound for example is paraffin. For example, the barrier layer is formed by applying the paraffin in liquid state to the region of the first surface of the first substrate of the display panel corresponding to the IC attaching region. For example, the barrier layer made of paraffin is removed in a heating manner.

In the above thinning process, for example, the thinning fluid is hydrofluoric acid, the barrier layer is made of the material containing hydrocarbon compound, and the hydrocarbon compound is polyethylene. For example, the barrier layer is formed by applying the polyethylene in liquid state to the region of the first surface of the first substrate of the display panel corresponding to the IC attaching region. For example, the barrier layer made of polyethylene is removed by being heated to 70□ or more and dissolved in a methylbenzene, amyl acetate or trichloroethylene solvent.

It is noted that the material of the barrier layer is not limited to paraffin or polyethylene as long as no chemical reaction occurs between the thinning fluid and the barrier layer, and the material of the barrier layer can be flexibly selected in an actual thinning process.

In FIG. 2, the display panel comprises for example the array substrate 1 and the color filter substrate 2 that are bonded with each other and a liquid crystal layer (not shown in FIG. 2) provided therebetween. Generally, in order to improve a fabrication efficiency, a large panel (mother panel) is formed to comprise the sub-display panels 8 with smaller size, and then the display panels 8 are obtained by performing a cutting or splitting process on the large panel after the assembling process and thinning process are finished.

For example, the fabrication method of the display panel of the present disclosure further comprises a cutting process. For example, in order to obtain a good cutting effect, before the cutting process, the method further comprises: filling the region of the first surface of the first substrate 1 at least corresponding to the display region with a filler (for example, the non-IC attaching region of the non-display region is also filled); and after the cutting process, the method further comprises: removing the filler in the region of the first surface of the first substrate 1 at least corresponding to the display region (for example, the filler in the non-IC attaching region of the non-display region is also removed).

For example, the step of filling the region of the first surface of the first substrate at least corresponding to the display region with the filler includes: attaching a compensation film to the region of the first surface of the first substrate at least corresponding to the display region (for example, the compensation film is also attached to other regions such as the non-IC attaching region of the non-display region). For example, the thickness of the compensation film is less than or equal to the thickness difference between the IC attaching region and the display region of the first substrate. For example, the step of removing the filler in the region of the first surface of the first substrate at least corresponding to the display region includes: stripping the compensation film (for example, the filler in other regions such as the non-IC attaching region of the non-display region is also removed).

After the sub-display panel 8 is formed, the fabrication method of the display panel further comprises steps of:

Attaching the lower polarization sheet to the region of the first surface of the first substrate corresponding to the display region, the first substrate being provided with the IC attaching region;

Attaching the upper polarization sheet to the region of the second surface of the second substrate corresponding to the display region, the second substrate is provided to be opposite to the first substrate; and Bonding the driver IC 7 to the IC attaching region of the first substrate.

For example, the lower polarization sheet is attached to the region of the back surface (i.e., the first surface of the first substrate) of the display panel corresponding to the display region, and the thickness of the lower polarization sheet is equal to the difference between the thickness of the region of the first substrate corresponding to the IC attaching region and the thickness of the region of the first substrate corresponding to the display region. It is easily understood that, in the case that the display panel is the OLED display panel, the step of attaching the polarization sheet can be omitted as the polarization sheet is not needed.

In order to clearly describe the fabrication method of the display panel in the embodiments of the present disclosure, a process of thinning the display panel with a double-sided thickness being 1.0 mm to a Q-panel with the display region being 0.4 mm thick and the lower polarization sheet being 0.1 mm thick is taken as an example for detailed description. The Q-panel is a secondary large panel which has undergone one cut process and has a plurality of sub-display panels 8 (in other words, the mother panel is cut into plural pieces, each piece contains plural small sub-display panels, and every such piece is called as the Q-panel). For example, each sub-display panel 8 includes the color filter substrate 2, the array substrate 1 and the liquid crystal layer disposed therebetween. The fabrication method of the display panel comprises steps of:

Step S1): thinning the Q-panel for a first time.

Figure 3A:
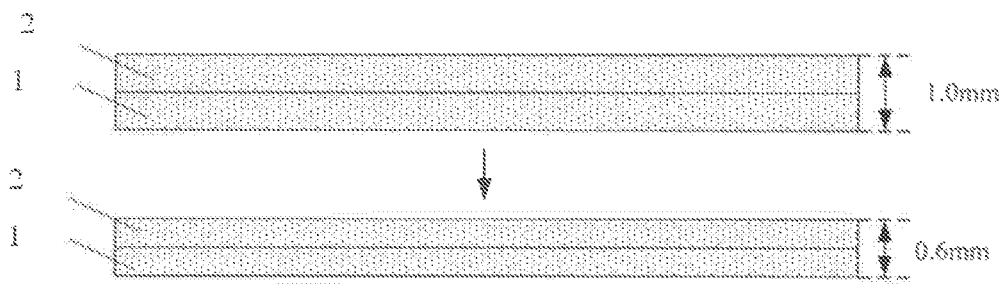
FIGS. 3A-3H are schematic views illustrating a fabrication method of a display panel according to the embodiments of the present disclosure.

In this step, as shown in FIG. 3A, the whole Q-panel is thinned so that a single-sided thickness is 0.3 mm by corroding with thinning fluid.

Step S2): coating the region of the Q-panel corresponding to the IC attaching region with the barrier layer 3.

Figure 3B:
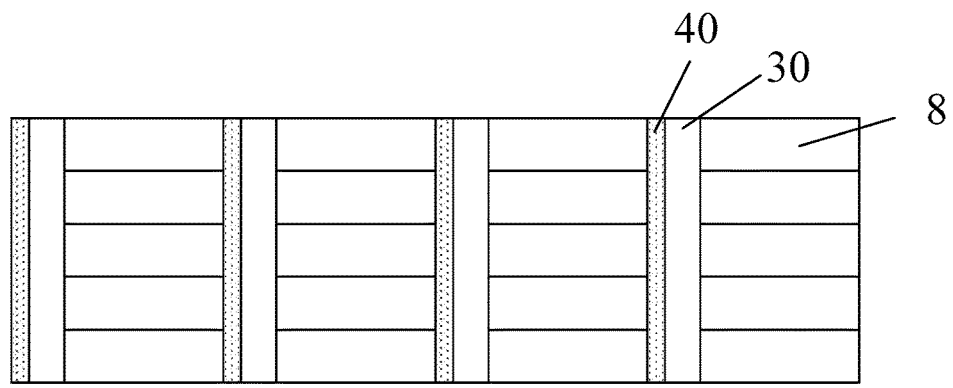
Figure 3C:
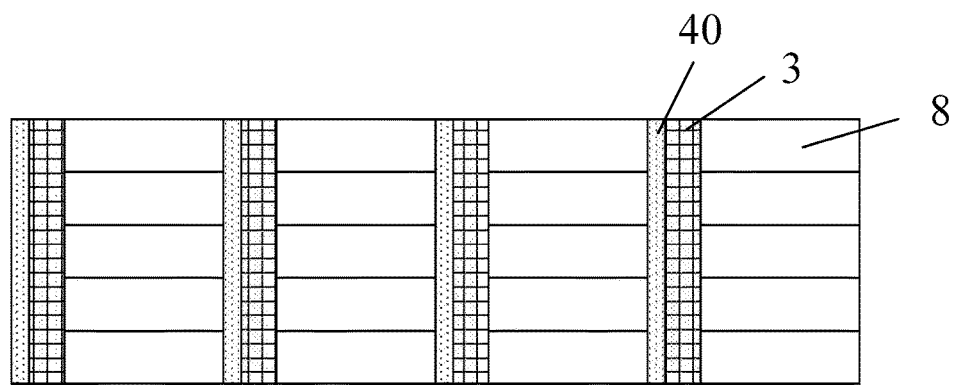
Figure 3D:
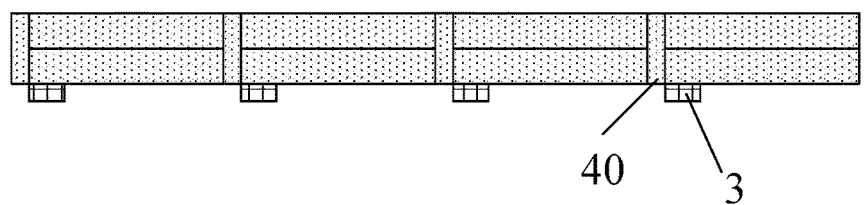

In this step, the IC attaching region 30 of the first substrate 1 (the IC attaching region 30 of the Q-panel is located on the edge of the sub-display panels) is coated with liquid paraffin (or polyethylene, etc.). As shown in FIGS. 3B-3D, a 4×5 Q-panel is taken as an example, wherein, FIG. 3B is a top view of the first substrate, and FIGS. 3C and 3D are respectively a top view and a section view of the first substrate coated with the barrier layer. The pattern of the liquid paraffin (or polyethylene, etc.) forms a continuous strip along the IC attaching region 30 in the non-display region of each sub-display panel 8. For example, an area of the coated paraffin (or polyethylene, etc.) is larger than the IC attaching region 30 of the first substrate 1 to form the barrier layer 3 with the area larger than the IC attaching region, and achieve a better protection action.

In FIGS. 3B-3D, the reference sign 40 indicates a cutting region. In the case that the Q-panel is cut into sub-display panels 8, cutting is performed in the cutting region 40

Step S3): thinning the Q-panel for a second time.

Figure 3E:
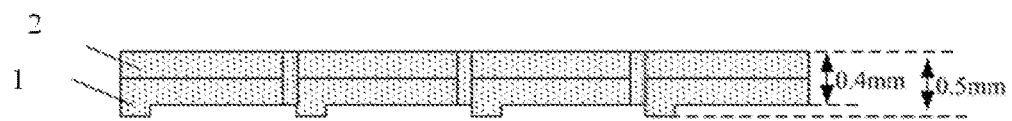

In this step, as shown in FIG. 3E, the Q-panel with the double-sided thickness being 0.6 mm is thinned to the double-sided thickness being 0.4 mm (i.e., the single-sided thickness is 0.2 mm). After the thinning process, the thickness of the display region (of course also including the non-IC attaching region of the non-display region) of the Q-panel is 0.4 mm and the thickness of the IC attaching region is 0.5 mm.

In the thinning process of the above steps S1) and S3), the thinning fluid is, for example, HF, which is an aqueous solution of HF gas and is transparent to light yellow smoking liquid with a molecular formula: $HF.H_2O$. HF is a weak acid, and reacts with a main component $SiO_2$ in the glass substrate to generate $H_2SiF_6$ that is soluble to water, a reaction formula therebetween is $6HF+SiO_2 \rightarrow H_2SiF_6+2H_2O$, thereby thinning the display panel. In the thinning process, the region coated with the paraffin (or polyethylene etc.) has the barrier layer 3, such that HF cannot be in contact with the glass substrate in such region and cannot react with $SiO_2$, and thus cannot reduce the thickness of the glass substrate corresponding to such region.

Step S4): removing the barrier layer 3.

In this step, after the thinning process is finished, the paraffin is removed by heating (or the polyethylene is removed by heating and dissolving), thereby obtaining the Q-panel of which the region of the first substrate corresponding to the IC attaching region has the single-sided thickness of 0.3 mm thick and the display region (also including other regions outside the IC attaching region) has the single-sided thickness of 0.2 mm. By partially thinning the display panel, the driver IC is prevented from generating bending after the IC attaching region is bonded with the driver IC.

After the above steps S1)-S4), the thinning process is finished.

Step S5): filling an uneven region of the bottom of the Q-panel with the compensation film 4 to facilitate a smooth operation of a later second cutting.

Figure 3F:
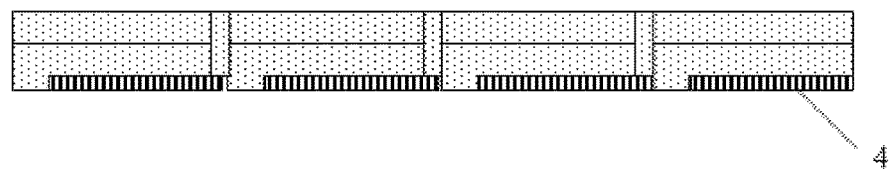

In this step, the uneven region of the bottom of the Q-panel mainly includes a display region, and for example further includes all or part of the non-IC attaching region of the non-display region. As shown in FIG. 3F, the compensation film 4 is selectively attached or not attached as long as the smooth second cutting process is ensured and yield of the display panel in the second cutting process is ensured. The back side surface of the display panel becomes flush by using the compensation film 4.

Step S6): performing the second cutting to obtain the single sub-display panel 8 (single cell).

Step S7): attaching the lower polarization sheet 5.

Figure 3G:
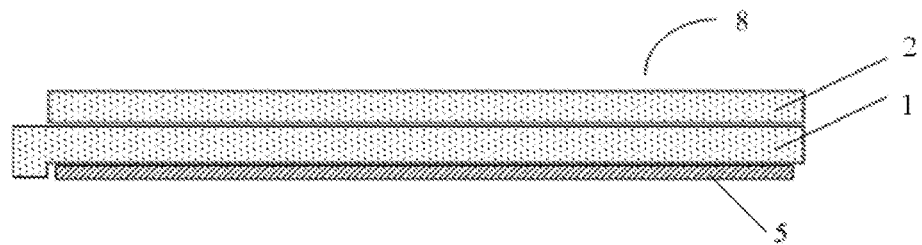

In this step, as shown in FIG. 3G, the protruding region on the first surface side of the first substrate 1 corresponding to the IC attaching region has a height same as the thickness of the lower polarization sheet 5. That is, the lower polarization sheet 5 and the protruding region are flush with each other. The lower polarization sheet 5 here further performs a function of filling, such that in the case that the lower polarization sheet 5 ensures optical properties of the display pane, the lower polarization sheet 5 further ensures to form a flat surface with the protruding region when the driver IC is bonded to the IC attaching region, avoiding damage to the display panel.

Step S8): attaching the upper polarization sheet 6.

In this step, the second surface of the second substrate 2 is attached with the upper polarization sheet 6, and the upper polarization sheet 6 covers all the second surface of the second substrate.

The steps S7) and S8) are of a module process. Of course, for the OLED display panel, the steps S7) and S8) can be omitted.

Step S9): bonding the driver IC in the IC attaching region.

In this step, the driver IC is bonded in the IC attaching region.

Figure 3H:
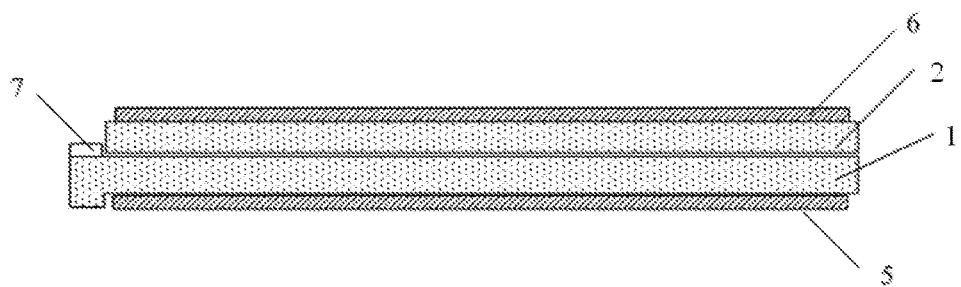

The structure after attaching the upper polarization sheet 6 and bonding the driver IC 7 is as shown in FIG. 3H.

Through the above steps, the single display panel as shown in FIG. 2 can be formed. In the display panel, since the thickness of the IC attaching region of the first substrate 1 is increased, the bending of the driver IC is reduced, and therefore, the COG Mura defect caused by the bending of the driver IC is well avoided.

Figure 4:
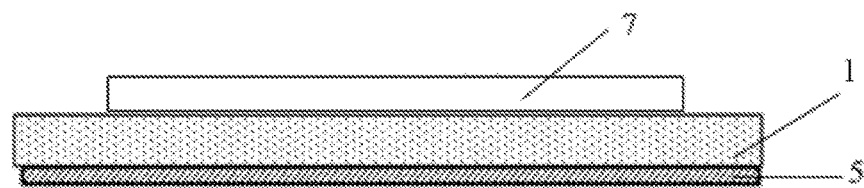
FIG. 4 is a schematic view illustrating that the driver IC in the IC attaching region of the display panel shown in FIG. 2 has no bending.

As shown in FIG. 4, it is apparent that the bending of the driver IC in the display panel is reduced or basically avoided. Further, in order to validate the performance of the display panel, a validating test is performed; and a test result shows that: in the case that the thickness of the driver IC is kept unchanged, the greater the thickness of the first substrate in the IC attaching region is, the smaller the defect is. It can be seen that, the deformation of the driver IC is reduced along with the increase of the thickness of the IC attaching region of the first substrate, and thus the performance of the display panel is improved.

According to the embodiments of the present disclosure, in the thinning process, the material containing hydrocarbon compound such as paraffin (or polyethylene, etc.) which is not reacted with the thinning fluid HF is coated onto the surface of the display panel, to control the reduced thickness of the display panel in the thinning process so as to ensure that the thickness of the IC attaching region of the first substrate is greater than the thickness of other regions (at least comprising the display region) except for the IC attaching region of the first substrate, and therefore, different regions of the first substrate have different thicknesses, a problem of shrinkage and deformation caused by the fact that the non-IC attaching region of the first substrate is too thin and insufficient in strength in the bonding process of the driver IC is avoided, and thus the COG Mura defect is avoided; further, as the thickness of the IC attaching region of the first substrate is increased, defects such as a black screen caused by the damage to the first substrate occurring during a falling test is avoided, and the strength and reliability of the device are improved.

The display panel and the corresponding fabrication method of the display panel are simple and easy to implement, greatly reduce the COG Mura defect, and are suitable for forming different regions with different thicknesses in the display panel, especially are suitable for a preparing process that the thickness of the IC attaching region in the first substrate is increased and the strength of this region is improved to avoid the deformation of the driver IC in the bonding process of the driver IC.

The embodiments of the present disclosure further provide a display device. The display device comprises the aforesaid display panel.

Figure 5:
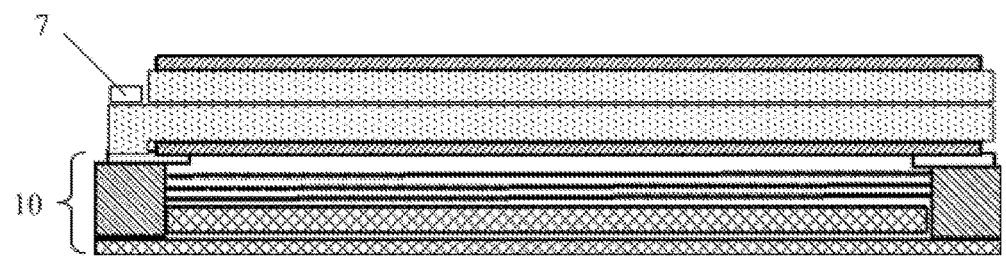
FIG. 5 is a structural schematic view illustrating a display device according to the embodiments of the present disclosure.

For example, the display panel is the liquid crystal display panel, and the display device as shown in FIG. 5 is obtained by assembling a backlight 10 to the liquid crystal display panel.

The display device for example is: a liquid crystal panel, an electronic paper, an OLED panel, a cellphone, a tablet computer, a television, a display, a laptop, a digital photo frame, a navigator and any product or part with a display function.

The display device adopts the abovementioned display panel and therefore has a better display effect.

The foregoing embodiments merely are exemplary embodiments of the disclosure, and not intended to define the scope of the disclosure, and the scope of the disclosure is determined by the appended claims.

The application claims priority of Chinese Patent Application No. 201510300898.9 filed on Jun. 3, 2015, the disclosure of which is incorporated herein by reference in its entirely as part of the present application.

The invention claimed is:

1. A fabrication method of a display panel, the display panel comprising a first substrate, the display panel being divided into a display region and a non-display region, and the non-display region of the first substrate including an integrated circuit (IC) attaching region, wherein
the fabrication method comprises a thinning process;
the thinning process includes:
forming a barrier layer insoluble to a thinning fluid in a region of a first surface of the first substrate of the display panel corresponding to the IC attaching region;
thinning the display panel by adopting the thinning fluid such that a thickness of the IC attaching region of the first substrate is greater than a thickness of the display region of the first substrate; and
removing the barrier layer; and
the display panel further comprises a second substrate opposite to the first substrate, the first substrate has a protrusion portion protruding out of the second substrate, and the IC attracting region of the first substrate, which has the thickness greater than the thickness of the display region of the first substrate, is provided within the Protrusion portion.

2. The fabrication method of the display panel according to claim 1, wherein the thinning fluid is hydrofluoric acid, and the barrier layer is made of a material containing hydrocarbon compound.

3. The fabrication method of the display panel according to claim 2, wherein
the hydrocarbon compound is paraffin, and the barrier layer is formed by applying the paraffin in liquid state to the region of the first surface of the first substrate of the display panel corresponding to the IC attaching region; and
the barrier layer is removed by heating.

4. The fabrication method of the display panel according to claim 2, wherein
the hydrocarbon compound is polyethylene, and the barrier layer is formed by applying the polyethylene in liquid state to the region of the first surface of the first substrate of the display panel corresponding to the IC attaching region; and
the barrier layer is removed by being heated to 70° C. or more and dissolved in a methylbenzene, amyl acetate or trichloroethylene solvent.

5. The fabrication method of the display panel according to claim 1, wherein an area of the barrier layer is greater than or equal to that of the IC attaching region of the first substrate.

6. The fabrication method of the display panel according to claim 1, wherein
the fabrication method further comprises: cutting the display panel;
before cutting, the fabrication method further comprises: filling a region of the first surface of the first substrate at least corresponding to the display region with a filler; and
after cutting, the fabrication method further comprises: removing the filler in the region of the first surface of the first substrate at least corresponding to the display region.

7. The fabrication method of the display panel according to claim 6, wherein
the filling the region of the first surface of the first substrate at least corresponding to the display region with the filler includes: attaching a compensation film to the region of the first surface of the first substrate at least corresponding to the display region, a thickness of the compensation film being less than or equal to a thickness difference between the IC attaching region and the display region in the first substrate; and
the removing the filler in the region of the first surface of the first substrate at least corresponding to the display region includes: stripping the compensation film.

8. The fabrication method of the display panel according to claim 1, wherein
the second substrate disposed in the display region; and
the fabrication method further comprises:
attaching a polarization sheet to a region of the first surface of the first substrate corresponding to the display region;
attaching another polarization sheet to a region of a second surface of the second substrate corresponding to the display region; and
bonding the driver IC to the IC attaching region of the first substrate.

9. The fabrication method of the display panel according to claim 8, wherein
on the first surface side of the first substrate, a thickness of the polarization sheet is equal to a difference between the thickness of the first substrate corresponding to the IC attaching region and the thickness of the first substrate corresponding to the display region.

10. The fabrication method of the display panel according to claim 8, wherein the first surface of the first substrate is away from the second substrate, and the second surface of the second substrate is away from the first substrate.

11. A fabrication method of a display panel, the display panel comprising a first substrate, the display panel being divided into a display region and a non-display region, and the non-display region of the first substrate including an Integrated circuit (IC) attaching region, wherein
the fabrication method comprises a thinning process;
the thinning process includes:

forming a barrier layer insoluble to a thinning fluid in a region of a first surface of the first substrate of the display panel corresponding to the IC attaching region;

thinning the display panel by adopting the thinning fluid such that a thickness of the IC attaching region of the first substrate is greater than a thickness of the display region of the first substrate; and removing the barrier layer;

the fabrication method further comprises: cutting the display panel;

before cutting, the fabrication method further comprises: filling a region of the first surface of the first substrate at least corresponding to the display region with a filler; and after cutting, the fabrication method further comprises: removing the filler in the region of the first surface of the first substrate at least corresponding to the display region.

12. A fabrication method of a display panel, the display panel comprising a first substrate and a second substrate opposite to each other, the display panel being divided into a display region and a non-display region, and the non-display region of the first substrate including an Integrated circuit (IC) attaching region, wherein the fabrication method comprises a thinning process;

the thinning process includes:

forming a barrier layer Insoluble to a thinning fluid in a region of a first surface of the first substrate of the display panel corresponding to the IC attaching region;

thinning the display panel by adopting the thinning fluid such that a thickness of the IC attaching region of the first substrate is greater than a thickness of the display region of the first substrate; and removing the barrier layer;

the fabrication method further comprises:

attaching a polarization sheet to a region of the first surface of the first substrate corresponding to the display region;

attaching another polarization sheet to a region of a second surface of the second substrate corresponding to the display region; and bonding the driver IC to the IC attaching region of the first substrate.

* * * * *